United States Patent
Kwon et al.

[11] Patent Number: 6,093,029
[45] Date of Patent: Jul. 25, 2000

[54] VERTICALLY STACKABLE INTEGRATED CIRCUIT

[75] Inventors: Young Kwon, San Jose; Jon Ewanich, Los Altos; Bill Gervasi, Los Gatos; Paul Franklin, Santa Cruz, all of Calif.

[73] Assignee: S3 Incorporated, Santa Clara, Calif.

[21] Appl. No.: 09/149,549

[22] Filed: Sep. 8, 1998

[51] Int. Cl.[7] ............................................ H01R 12/00
[52] U.S. Cl. ........................... 439/69; 257/685; 257/686; 361/790
[58] Field of Search ....................... 439/69, 68; 257/686, 257/685; 361/388, 689, 790, 735

[56] References Cited

U.S. PATENT DOCUMENTS

| | | | |
|---|---|---|---|
| 4,656,605 | 4/1987 | Clayton | 365/52 |
| 4,684,184 | 8/1987 | Grabbe et al. | 439/64 |
| 4,696,525 | 9/1987 | Coller et al. | 439/69 |
| 4,727,513 | 2/1988 | Clayton | 365/52 |
| 4,833,568 | 5/1989 | Berhold | 361/383 |
| 4,850,892 | 7/1989 | Clayton | 439/326 |
| 4,868,712 | 9/1989 | Woodman | 361/388 |
| 4,953,060 | 8/1990 | Lauffer et al. | 361/388 |
| 5,241,450 | 8/1993 | Bernhardt et al. | 361/689 |
| 5,330,359 | 7/1994 | Walker | 439/69 |
| 5,376,825 | 12/1994 | Tukamoto et al. | 257/685 |
| 5,380,681 | 1/1995 | Hsu | 437/209 |
| 5,383,269 | 1/1995 | Rathmell et al. | 29/830 |
| 5,426,563 | 6/1995 | Moresco et al. | 361/689 |
| 5,429,511 | 7/1995 | DelPrete et al. | 439/69 |
| 5,445,526 | 8/1995 | Hoshino et al. | 439/69 |
| 5,455,740 | 10/1995 | Burns | 361/735 |
| 5,481,133 | 1/1996 | Hsu | 257/621 |
| 5,502,667 | 3/1996 | Bertin et al. | 365/51 |
| 5,512,783 | 4/1996 | Wakefield et al. | 257/693 |
| 5,543,660 | 8/1996 | Dombroski | 257/707 |
| 5,586,009 | 12/1996 | Burns | 361/735 |
| 5,612,570 | 3/1997 | Eide et al. | 257/686 |
| 5,619,067 | 4/1997 | Sua et al. | 257/686 |
| 5,666,272 | 9/1997 | Moore et al. | 361/735 |
| 5,726,493 | 3/1998 | Yamashita et al. | 257/698 |
| 5,734,555 | 3/1998 | McMahon | 361/704 |
| 5,821,625 | 10/1998 | Yoshida et al. | 257/777 |
| 5,963,430 | 10/1999 | Londa | 361/790 |

*Primary Examiner*—Renee Luebke
*Assistant Examiner*—Michael C. Zarroli
*Attorney, Agent, or Firm*—Fenwick & West LLP

[57] ABSTRACT

An arrangement for coupling a first packaged integrated circuit to a second packaged integrated circuit comprises a first packaged integrated circuit that includes a first set of electrical interconnection elements arranged on a first surface and a second set of electrical interconnection elements arranged on a second surface which is opposite to the first side. A thermally conductive material is disposed on the second surface and the second set of electrical interconnection elements are arranged around at least a portion of the periphery of the second surface. A second packaged integrated circuit includes a third set of electrical interconnection elements arranged on a first surface of the second packaged integrated circuit. The third set of electrical interconnection elements are shaped to mechanically and electrically couple and decouple to or from the second set of electrical interconnection elements non-destructively by application of manual force.

14 Claims, 5 Drawing Sheets

VERTICALLY STACKABLE INTEGRATED CIRCUIT

FIELD OF THE INVENTION

This invention relates generally to packaging of integrated circuits and more particularly to interconnection of packaged integrated circuits.

BACKGROUND OF THE INVENTION

It is often desirable in computer systems to allow for upgrading or addition of various integrated circuits or printed circuit boards. For example, it is often desirable to allow various chips, such as the microprocessor, to be replaceable to provide greater performance. It is also desirable to allow additional chips such as memory chips to be added. From a user's perspective, it is preferable that upgrades be capable of being performed by untrained personnel with a minimum of tools. From a system designer's perspective, the capability for additional or different parts must be designed into the system. In particular, with respect to additional parts such as memory chips or cards, careful consideration must be given to the placement of such chips or cards to ensure timing requirements are met. Such timing requirements are particularly stringent for high-performance systems that operate at high clock rates.

Add-in cards, which comprise one or more integrated circuits on a printed circuit board offer a well known component add-in capability. An example of such an add-in card is described in U.S. Pat. No. 4,656,605 to Clayton entitled "Single In-Line Memory Module." Increasingly, there is a need to allow addition or replacement of additional chips, as the functions performed on cards become integrated into single chips. Ideally, such chips should be user installable, and require little or no tools or specialized knowledge.

SUMMARY OF THE INVENTION

In a principal aspect, the present invention allows easier replacement and addition of packaged integrated circuits to an electronic system. In accordance with the principles of the present invention, a first packaged integrated circuit comprises a first set of electrical connection elements disposed on an upper surface of the first packaged integrated circuit, and a second packaged integrated circuit comprises a second set of electrical connection elements disposed on a lower surface of the second packaged integrated circuit. At least a portion of the second set of electrical connection elements are arranged to electrically couple, and to non-destructively decouple, with corresponding electrical connection elements of the first set of electrical connection elements by application of manual force.

Advantageously, embodiments employing the foregoing principles provide simplified addition and/or replacement of integrated circuits. No additional tools are required and little or no specialized knowledge is required. Allowing additional integrated circuits to be positioned above existing components allows increased performance by reducing the total length signals between signals in the two integrated circuits. The positional relationship achieved between two integrated circuits employing the principles described herein also reduces the variation between signal path lengths, thereby providing for more predictable signal response.

These and other features and advantages of the invention will be understood by considering the following detailed description of certain preferred embodiments. In the course of this description, reference will be made to the attached drawings.

DETAILED DESCRIPTION OF THE PREFERRED EMBODIMENTS

Figure 1A:
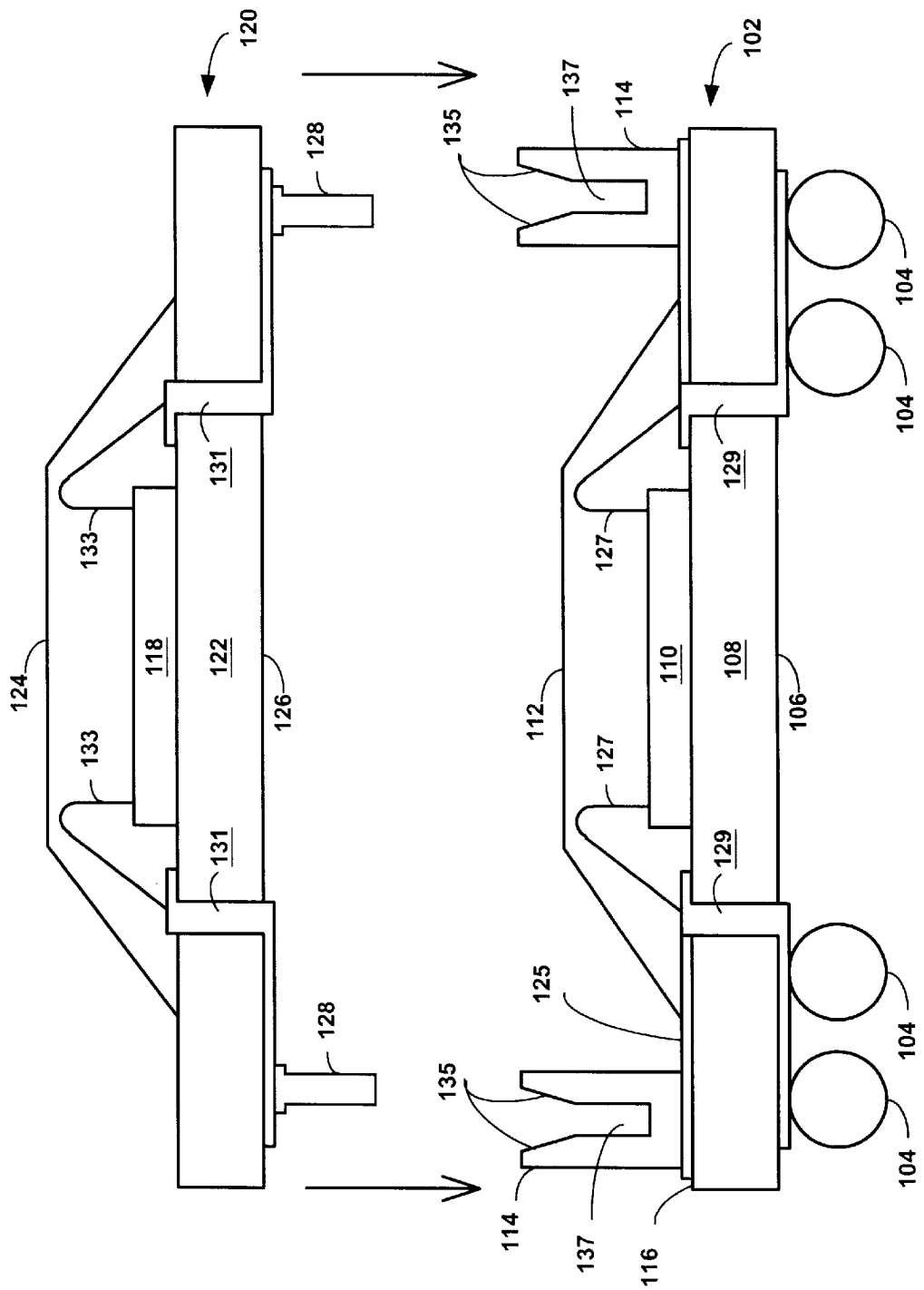
FIGS. 1(a) and 1(b) are cross-sectional side views of a first embodiment of first and second packaged integrated circuits employing the principles of the present invention.

In FIG. 1(a), a first packaged integrated circuit 102, includes a plurality of electrical first interconnection elements 104 attached to a first surface 106 of the integrated circuit 102. The first interconnection elements 104 preferably take the form of solder balls arranged in an array on the surface 106 of the integrated circuit 102. In an exemplary embodiment, the solder balls 104 take the form of electrical interconnection elements typically found on Ball Grid Array (BGA) type packaging for semiconductor circuits. The integrated circuit 102 is comprised of a substrate 108, and an integrated circuit die 110 mounted on the substrate 108, and housed within a mold cap 112. The integrated circuit 102 also includes second interconnection elements 114 mounted to a second surface 116, opposite to the first surface 106 of the integrated circuit. The second interconnection elements 114 are physically attached to substrate 108 and are each electrically coupled to semiconductor die 110 by a trace 125 and an appropriate bonding wire, such as shown at 127. The exact manner in which electrical second interconnection element 114 is attached to substrate 108 and electrically coupled to semiconductor die 110 is not critical and may take a number of forms. Preferably, second interconnection element 114 is positioned along a periphery of substrate 108. The trace 125 is imprinted on or within substrate 108 and is connected to semiconductor die 110 by way of bonding wire 127. The second interconnection elements 114 provide an electrical path for certain signals to be transmitted between semiconductor die 110 and a semiconductor die 118 mounted within packaged integrated circuit 120. The interconnection elements 104 are physically attached to substrate 108 and are each electrically coupled to semiconductor die 110 by a trace 129 that extends through substrate 108 and is connected to an appropriate bonding wire 127. Integrated circuit 102 is preferably formed by modifying a conventional BGA-type package such as available from Amkor Technology, Santa Clara, Calif.

Packaged integrated circuit 120 includes semiconductor die 118 mounted to substrate 122 and enclosed within a mold cap 124. Integrated circuit 120 has a first surface 126 attached to a plurality of electrical interconnection elements 128. Interconnection elements 128 in such an embodiment takes the form of a pin such as found in conventional Pin Grid Array (PGA) structures for semiconductor chips. The interconnection elements 128 are each electrically coupled to semiconductor die 118 by a trace 131 and a bonding wire 133. The trace 131 extends through substrate 122 and is connected to bonding wire 133. The interconnection elements 128 in an exemplary embodiment are positioned around the periphery of the integrated circuit 120 and are formed to mechanically and electrically couple with corresponding second interconnection elements 114 on integrated circuit 102. Second interconnection elements 114 each preferably take the form of a cylindrical female receptor pin with a conical section 135 formed in an upper portion of a receptor hole 137 to guide the male element 128 into the receptor hole 137. This structure advantageously facilitates fitting of the male element 128 into the female element 114. The female element 114 is preferably sized to allow a pressure fit, by manually applied force, between elements 114 and 128 sufficient to allow reliable electrical and mechanical coupling while allowing element 128 to be removed non-destructively, by manually applied force, from element 114.

Figure 1B:
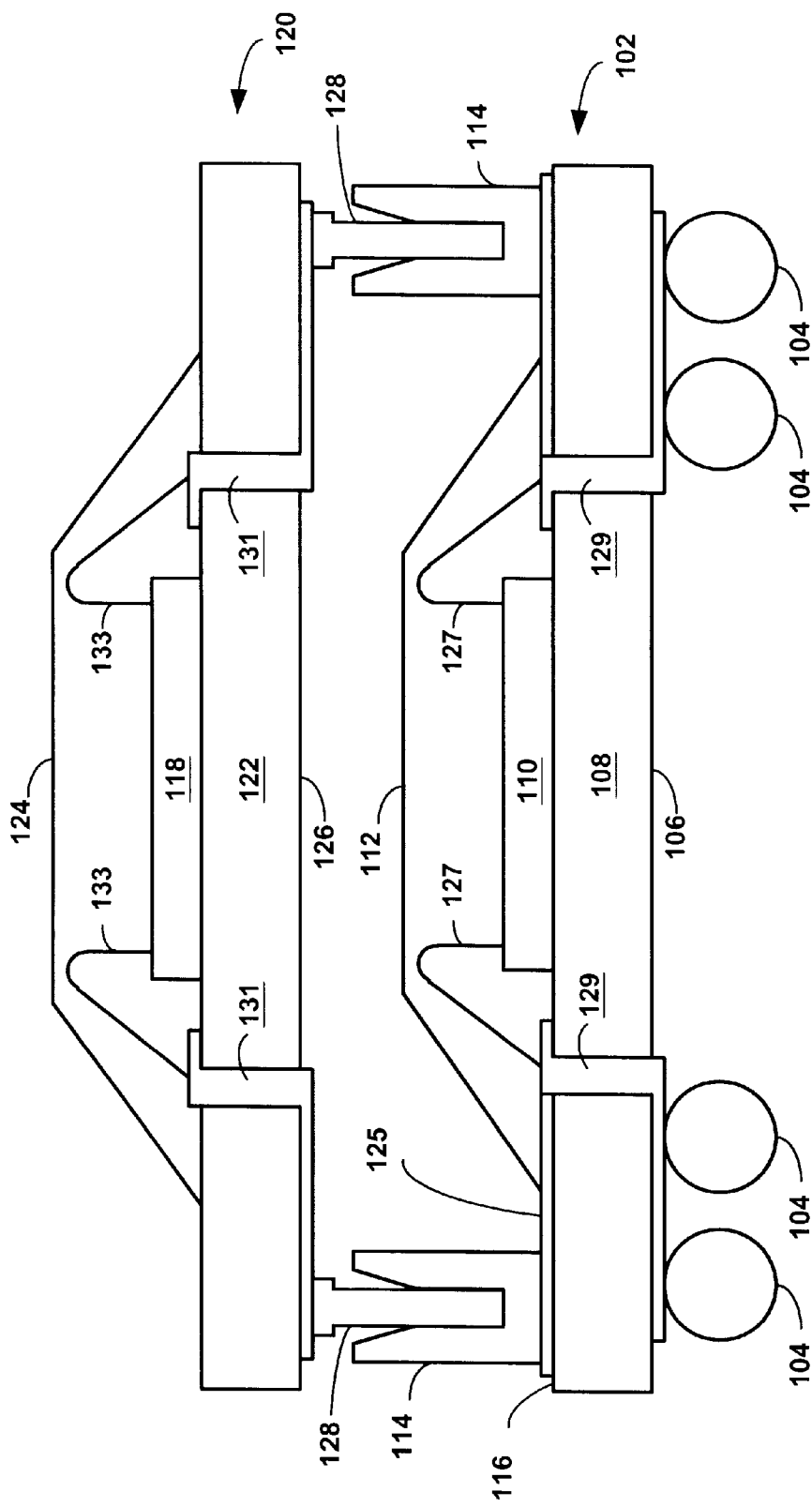

FIG. 1(*b*) illustrates integrated circuits 102 and 120 positioned in a manner to cause mechanical and electrical coupling between interconnection elements 114 and interconnection elements 128. The arrangement of the interconnection elements 114 and 128 allow the circuits 120 and 102 to be mechanically and electrically coupled in a vertical arrangement. This arrangement minimizes space consumed on a circuit board within an electronic system such as a personal computer. Moreover, the vertical relationship between integrated circuits 102 and 120 minimizes the distance for electrical pathways between integrated circuit 102 and integrated circuit 120. Electrical performance is therefore superior to a system utilizing a third interconnection system such as a mother board or an add-in card, in which signals are transmitted from, for example, integrated circuit 102 via interconnection elements 104 across traces and imprinted on a circuit board to corresponding interconnection elements and integrated circuit 120. As will be appreciated by those skilled in the art, such an arrangement results in a greater average electrical interconnection distance between the two connected devices. Moreover, the variation between maximum and minimum signal traces to allow multiple signals to be transmitted between the two integrated circuits is minimized in the arrangement shown in FIGS. 1(*a*) and 1(*b*) in comparison to a conventional arrangement in which two integrated circuits are interconnected by way of a printed circuit board.

Figure 2:
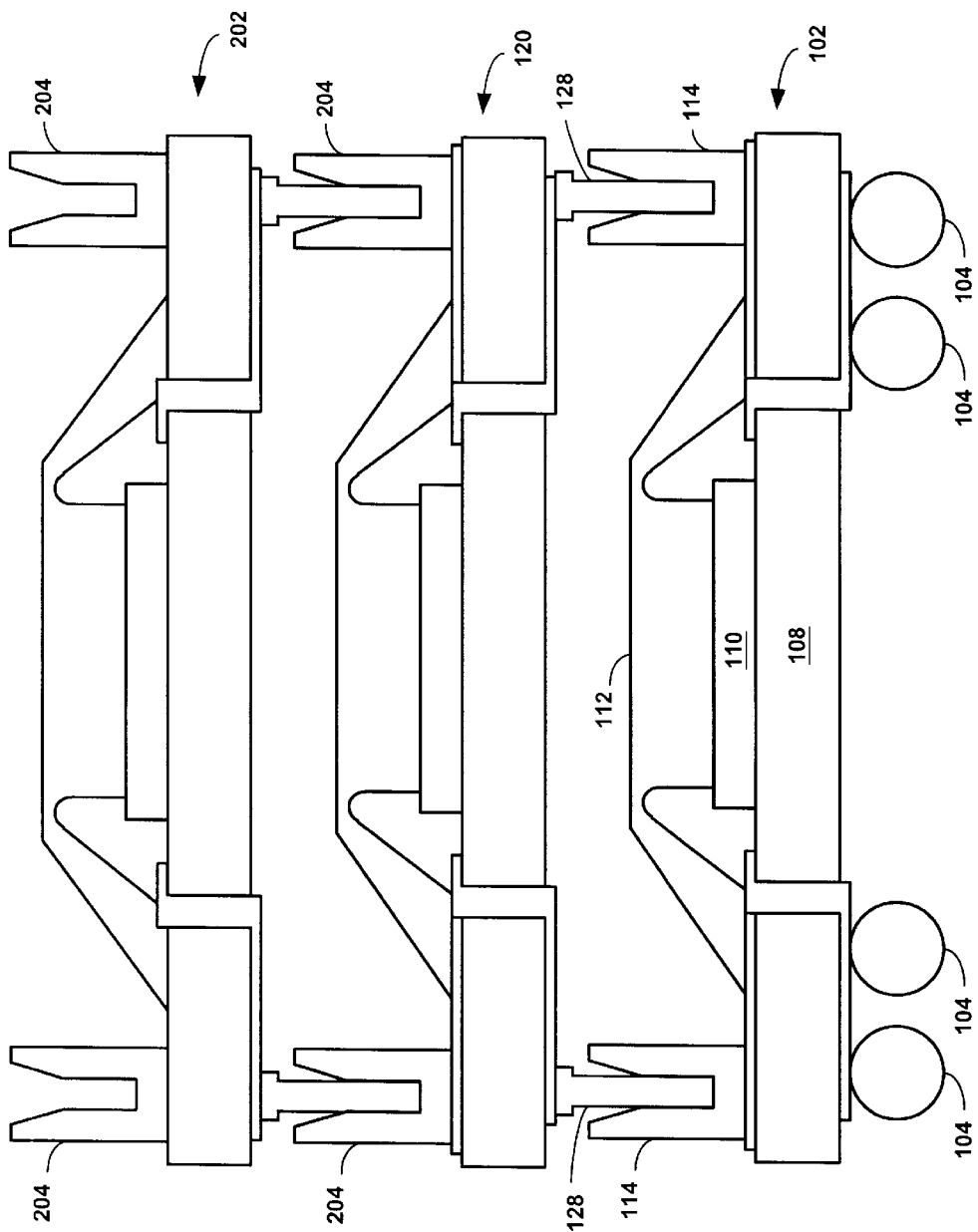
FIG. 2 is a cross-sectional side view of first, second and third packaged integrated circuits employing the principles of the present invention.

The arrangement shown in FIGS. 1(*a*) and 1(*b*) may be extended to allow coupling of additional integrated circuits such as shown in FIG. 2. As shown in FIG. 2, a third integrated circuit 202 is coupled to integrated circuit 120. Integrated circuit 120 is modified to include interconnection elements 204, which are mechanically attached and electrically coupled to integrated circuit 120 in a manner similar to interconnection elements 114 with respect to integrated circuit 102. Interconnection elements 204 can also take a form similar to the structure of interconnection elements 114.

FIGS. 1(*a*) and 1(*b*) show only the portion of integrated circuit 102 in which an interconnection element 114 is coupled to the signal on semiconductor die 110. The coupling of interconnection elements such as 104 to semiconductor die 110 are performed in a conventional manner as typically found in BGA-type packages. Advantageously, such packages may be readily modified to achieve the structures shown in FIGS. 1(*a*) and 1(*b*).

Figure 3:
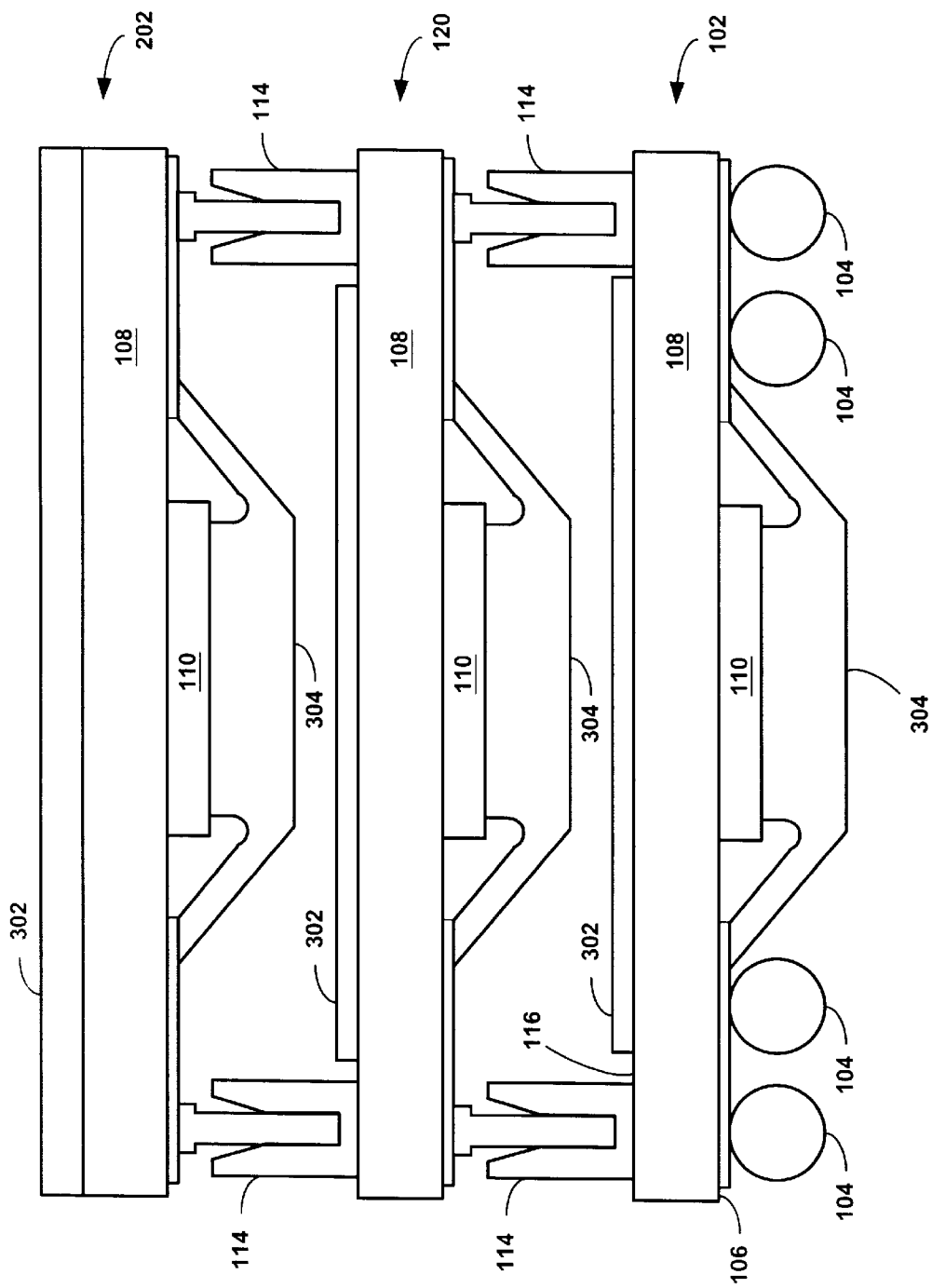
FIG. 3 is a cross-sectional side view of a variation of the arrangement of FIG. 2.

The integrated circuits shown in FIGS. 1(*a*), 1(*b*) and 2 take a form commonly known as a "cavity-up" package. This configuration is commonly used in standard Ball Grid Array (BGA) or Pin Grid Array (PGA) type packaging. The term "cavity-up" typically refers to the positioning of the semiconductor die on an upper surface of the substrate of the chip. "Cavity-down" type packaging is also commonly available and is typically used to achieve higher performance. In cavity-down type packaging, the semiconductor die is positioned to a lower surface of the integrated circuit substrate. This type of packaging is shown in simplified form in FIG. 3 which shows integrated circuits 102,120 and 202 each in a cavity-down type package. In FIG. 3, integrated circuit 102 takes the form of a cavity-down type high performance BGA type package in which the semiconductor die 110 is positioned on a lower surface 106 of substrate 108 and is surrounded by an encapsulant 304. The electrical interconnection elements 104 are positioned around a periphery of the substrate 108. The interconnection elements 114 are positioned upon upper surface 116. The semiconductor die 110 is positioned on surface 106, as are interconnection elements 104. Integrated circuits 120 and 202 are similar to integrated circuit 102 except that the balls of the BGA-type package of 102 are replaced in 120 and 202 with pins, as commonly found on PGA type packaging.

As shown in FIG. 3, the integrated circuit 102 includes a heat spreader 302, which comprises a thermally conductive material, such as copper, attached to upper surface 116 of substrate 108. Heat spreader 302 can occupy only a portion of the surface 116 or alternatively can occupy substantially the entire surface 116. Both the heat spreader 302 and exterior of the interconnection element 114 are generally formed of electrically conductive material and therefore, in order to prevent an electrical short, the heat spreader 302 should not physically contact the element 114. Alternatively, insulating material can be provided to electrically insulate element 114 from heat spreader 302 if the heat spreader is, or can expected to be (because of variations in manufacturing processes), in contact with element 114.

The exact form of packaging, cavity-up, cavity-down, or some alternative structure is not critical and can vary with the requirements of a particular application. The arrangements shown in FIGS. 1(*a*), 1(*b*), 2 and 3 can include combinations of integrated circuits packaged in cavity-up, cavity-down, or alternative structures, so long as the interconnection elements 114 and corresponding interconnection elements 128 are compatible.

The packaging described in the embodiments herein may be used to advantage in a number of applications. In an exemplary embodiment, the packaging used herein can be used in a graphics controller corresponding to integrated circuit 102 and in a memory device corresponding to integrated circuit 120. Graphics controllers are requiring increasingly larger amounts of memory to handle larger displays with higher resolution and greater pixel depths. Certain graphics controllers such as the ViRGE MXi graphics controller available from S3 Incorporated, Santa Clara, Calif., contain frame buffer memory within the graphics controller circuit. Certain users however, may find it beneficial to upgrade the memory capacity contained within the graphics controller. In such a situation, the graphics controller may be packaged in a manner similar to integrated circuit 102 and an integrated circuit containing memory in the form of dynamic random access memory, for example, may be packaged in the manner shown for integrated circuit 120. The graphics controller can then be provided as a standard component of a personal computer and the upgradable memory can then be subsequently installed by a user by aligning the interconnection elements 128 with corresponding interconnection elements 114 and manually pressing the integrated circuit 120 down on to integrated circuit 102 to cause mechanical and electrical coupling between interconnection elements 114 and interconnection elements 128.

When the integrated circuits 102 and 120 correspond to a graphics controller and a memory device respectively, the interconnection elements 114 and 128 operate to transmit address signals, data signals and control signals between graphics controller and the memory device. In such an embodiment, the appropriate address, data and control signals are coupled to interconnection elements 114 to achieve an electrical connection shown schematically in FIG. 4.

Figure 4:
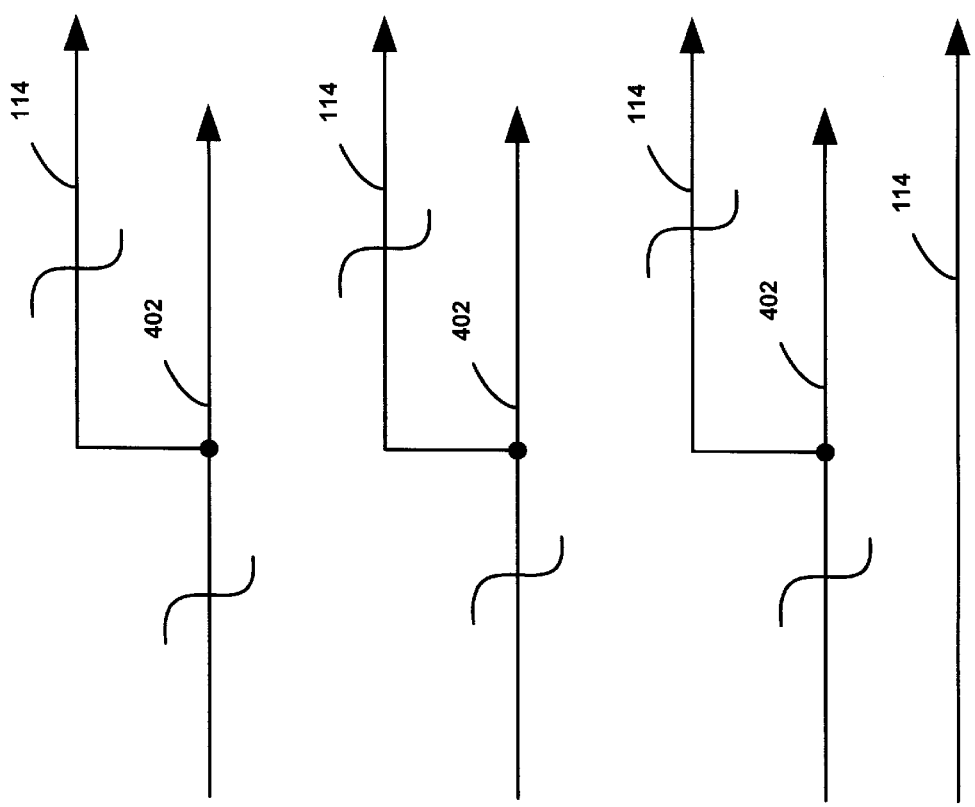
FIG. 4 is a simplified schematic illustrating an electrical coupling of packaged integrated circuits employing the principles of the present invention.

In FIG. 4, address data and control signals contained within integrated circuit 120 are shown generally at 402. Interconnection elements 114 are electrically coupled to the signals 402 in parallel in a manner shown in FIG. 4 to allow address data and control signals, which are transmitted to structures within integrated circuit 120, to also be transmitted to integrated circuit 102. In addition, certain dedicated signals, such as bank select signals for example, which are not transmitted internally to any destinations internally within integrated circuit 120 may be coupled to interconnection elements 114.

It is to be understood that the specific mechanisms and techniques which have been described herein are merely illustrative of one application of the principles of the present invention. Structures such as heat sinks and other heat dispersion structures may be added to the structures disclosed herein. In addition, the structures disclosed herein may be modified to provide greater heat dispersion capabilities. Numerous additional modifications may be made to the methods and apparatus described herein without departing from the true spirit of the invention.

What is claimed is:

1. Apparatus comprising:
    a first packaged integrated circuit comprising a first semiconductor die and a first set of electrical interconnection elements disposed on a surface of said first packaged integrated circuit, the first semiconductor die positioned in said first packaged integrated circuit in a "cavity-down" arrangement; and
    a second packaged integrated circuit comprising a second semiconductor die, a second set of electrical interconnection elements disposed on a lower surface of said second packaged integrated circuit, and a third set of electrical interconnection elements disposed on an upper surface of said second packaged integrated circuit, said second set of electrical interconnection elements being arranged to electrically couple and non-destructively decouple with corresponding electrical interconnection elements of said first set of electrical interconnection elements by application of manual force, said second semiconductor die serving as an electrical interface between said second and third sets of electrical interconnection elements.

2. Apparatus as set forth in claim 1 wherein said second semiconductor die is positioned in said second packaged integrated circuit in a "cavity-down" arrangement.

3. Apparatus as set forth in claim 1 wherein said first semiconductor die is positioned in said first packaged integrated circuit in a "cavity-up" arrangement.

4. Apparatus comprising:
    a first packaged integrated circuit comprising a first semiconductor die and a first set of electrical interconnection elements disposed on a surface of said first packaged integrated circuit; and
    a second packaged integrated circuit comprising a second semiconductor die, a second set of electrical interconnection elements disposed on a lower surface of said second packaged integrated circuit, and a third set of electrical interconnection elements disposed on an upper surface of said second packaged integrated circuit, said second set of electrical interconnection elements being arranged to electrically couple and non-destructively decouple with corresponding electrical interconnection elements of said first set of electrical interconnection elements by application of manual force, said second semiconductor die serving as an electrical interface between said second and third sets of electrical interconnection elements and wherein said second semiconductor die is positioned in said second packaged integrated circuit in a "cavity-down" arrangement.

5. Apparatus as set forth in claim 1 wherein said second semiconductor die is positioned in said second packaged integrated circuit in a "cavity-up" arrangement.

6. Apparatus as set forth in claim 1, said apparatus further comprising a third packaged integrated circuit comprising a fourth set of electrical interconnection elements disposed on a lower surface of said third packaged integrated circuit, said fourth set of electrical interconnection elements being arranged to electrically couple and to non-destructively decouple with corresponding electrical interconnection elements of said third set of electrical interconnection elements by application of manual force.

7. Apparatus comprising:
    a first packaged integrated circuit comprising,
        a first set of electrical interconnection elements arranged on a first surface of said first packaged integrated circuit; and
        a second set of electrical interconnection elements arranged on a second surface of said first packaged integrated circuit, said second surface being opposite from said first surface and said second surface comprising a substrate having a first side and a second side upon which a thermally conductive material resides, said second set of electrical interconnection elements arranged upon said second surface;
        a first semiconductor die residing upon said first side of said substrate; and
    a second packaged integrated circuit comprising,
        a third set of electrical interconnection elements arranged on a first surface of said second packaged integrated circuit and shaped to mechanically and electrically couple to said second set of electrical interconnection elements;
        a fourth set of electrical interconnection elements arranged on a second surface of said second packaged integrated circuit; and
        a second semiconductor die residing upon said second packaged integrated circuit and serving as an electrical interface between said third and fourth sets of electrical interconnection elements.

8. Apparatus as set forth in claim 7 wherein said second set of electrical interconnection elements are manually and electrically coupled to said third set of electrical interconnection elements by application of manual force.

9. Apparatus as set forth in claim 8 wherein said second set of electrical interconnection elements are capable of being non-destructively mechanically and electrically de-coupled from said third set of electrical interconnection elements by application of manual force.

10. Apparatus as set forth in claim 7 wherein said first set of electrical interconnection elements comprise solder balls formed to comprise a ball grid array type arrangement.

11. Apparatus comprising:
    a first packaged integrated circuit comprising,
        a first set of electrical interconnection elements arranged on a first surface of said first packaged integrated circuit; and a second set of electrical interconnection elements arranged on a second surface of said first packaged integrated circuit, said second surface being opposite from said first surface and comprising a substrate having a first side and a second side upon which a thermally conductive material resides, said second set of electrical interconnection elements arranged upon said second surface and extending through openings in said thermally conductive material;

a first semiconductor die residing upon said first side of said substrate; and a second packaged integrated circuit comprising, a third set of electrical interconnection elements arranged on a first surface of said second packaged integrated circuit and shaped to mechanically and electrically couple to said second set of electrical interconnection elements;

a fourth set of electrical interconnection elements arranged on a second surface of said second packaged integrated circuit; and a second semiconductor die residing upon said second packaged integrated circuit and serving as an electrical interface between said third and fourth sets of electrical interconnection elements.

12. Apparatus as set forth in claim 11 wherein said second set of electrical interconnection elements are manually and electrically coupled to said third set of electrical interconnection elements by application of manual force.

13. Apparatus as set forth in claim 12 wherein said second set of electrical interconnection elements are capable of being non-destructively mechanically and electrically de-coupled from said third set of electrical interconnection elements by application of manual force.

14. Apparatus as set forth in claim 11 wherein said first set of electrical interconnection elements comprise solder balls formed to comprise a ball grid array type arrangement.

* * * * *